(12) United States Patent
Kim

(10) Patent No.: US 9,870,977 B2
(45) Date of Patent: Jan. 16, 2018

(54) SEMICONDUCTOR DEVICE WITH HEAT INFORMATION MARK

(71) Applicant: SAMSUNG ELECTRONICS CO., LTD., Suwon-si, Gyeonggi-Do (KR)

(72) Inventor: Young-Deuk Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/294,495

(22) Filed: Oct. 14, 2016

(65) Prior Publication Data

US 2017/0110387 A1   Apr. 20, 2017

(30) Foreign Application Priority Data

Oct. 16, 2015   (KR) ................. 10-2015-0144890

(51) Int. Cl.
| | | |
|---|---|---|
| *H01L 23/34* | (2006.01) | |
| *H01L 23/42* | (2006.01) | |
| *H01L 23/544* | (2006.01) | |
| *H01L 23/36* | (2006.01) | |
| *H01L 23/31* | (2006.01) | |

(52) U.S. Cl.
CPC .............. *H01L 23/42* (2013.01); *H01L 23/36* (2013.01); *H01L 23/544* (2013.01); *H01L 23/3135* (2013.01); *H01L 2223/5442* (2013.01); *H01L 2223/54406* (2013.01); *H01L 2223/54426* (2013.01); *H01L 2223/54486* (2013.01)

(58) Field of Classification Search
CPC ..... H01L 23/42; H01L 23/367; H01L 23/544; H01L 23/3135

USPC ........................................ 257/712, 797
See application file for complete search history.

(56) References Cited

U.S. PATENT DOCUMENTS

| | | | | |
|---|---|---|---|---|
| 5,644,102 A | * | 7/1997 | Rostoker ............... | H01L 23/544 174/547 |
| 8,137,806 B2 | | 3/2012 | Okabayashi | |
| 2005/0241817 A1 | * | 11/2005 | Moore .................... | H01L 23/36 165/185 |
| 2012/0104591 A1 | * | 5/2012 | Warren ............... | H01L 23/4334 257/712 |
| 2013/0056871 A1 | * | 3/2013 | Yu ........................ | H01L 23/3114 257/738 |
| 2014/0247556 A1 | * | 9/2014 | Eid ....................... | H01L 23/3675 361/700 |
| 2015/0155218 A1 | | 6/2015 | Hung et al. | |
| 2015/0380337 A1 | * | 12/2015 | Yu ........................ | H01L 23/3114 257/712 |

FOREIGN PATENT DOCUMENTS

| | | |
|---|---|---|
| JP | 2000-277873 | 10/2000 |
| JP | 4607281 | 10/2010 |
| JP | 5096010 | 9/2012 |

(Continued)

*Primary Examiner* — Nitin Parekh
(74) *Attorney, Agent, or Firm* — F. Chau & Associates, LLC

(57) ABSTRACT

A semiconductor device includes a semiconductor package and a mark. The semiconductor package includes a semiconductor chip including a hot spot from which heat is generated, and a mold layer encapsulating the semiconductor chip. The mark is disposed on the semiconductor package. The mark is formed in a region of the semiconductor package that corresponds to a position of the hot spot.

16 Claims, 14 Drawing Sheets

(56) References Cited

FOREIGN PATENT DOCUMENTS

| KR | 1992-0007041 | 4/1992 |
| KR | 1999-0001731 | 1/1999 |
| KR | 10-0590093 | 6/2006 |
| KR | 10-0637208 | 10/2006 |
| KR | 10-0649195 | 11/2006 |

* cited by examiner (Comparative Example)

SEMICONDUCTOR DEVICE WITH HEAT INFORMATION MARK

CROSS-REFERENCE TO RELATED APPLICATIONS

This application claims priority under 35 U.S.C. §119 to Korean Patent Application No. 10-2015-0144890, filed on Oct. 16, 2015, the disclosure of which is incorporated by reference herein in its entirety.

TECHNICAL FIELD

Exemplary embodiments of the present inventive concept relate to a semiconductor device, and more particularly, to a semiconductor device including a mark indicating a position of a hot spot.

DISCUSSION OF THE RELATED ART

There is an increasing demand for small and light electronic products, and thus, for small and light semiconductor packages. A semiconductor package may suffer from thermal stress that occurs during its operation.

SUMMARY

Exemplary embodiments of the inventive concept provide a semiconductor device with improved thermal characteristics.

Exemplary embodiments of the inventive concept provide a semiconductor device having improved heat-dissipation characteristics. As a result, deterioration of the semiconductor device that may typically occur in a set assembly process may be prevented or reduced.

According to exemplary embodiments of the inventive concept, a semiconductor device includes a mark indicating a position of a hot spot.

According to exemplary embodiments of the inventive concept, a heat dissipation layer is provided to cover the mark, and still covers the mark even when the heat dissipation layer is moved from a proper attaching position.

According to exemplary embodiments of the inventive concept, the use of the mark results in a semiconductor device having efficient heat-dissipation characteristics.

According to exemplary embodiments of the inventive concept, a semiconductor device includes a semiconductor package in which a semiconductor chip encapsulated with a mold layer is provided. The semiconductor chip includes at least one hot spot from which heat is generated, and the semiconductor package includes at least one mark which is formed to contain information relating to a position of the at least one hot spot.

In exemplary embodiments, the mark includes symbols or figures which are engraved on a surface of the mold layer.

In exemplary embodiments, the mark includes a conductive layer, which is provided in the mold layer and has a surface exposed by the mold layer.

In exemplary embodiments, the conductive layer is spaced apart from the semiconductor chip.

In exemplary embodiments, the conductive layer is in contact with a portion of the semiconductor chip.

In exemplary embodiments, the semiconductor package further includes a heat dissipation plate provided on the mold layer. The mark includes at least one expanding portion which is provided at a position corresponding to the hot spot and has a protruding structure extending from the heat dissipation plate.

In exemplary embodiments, the mark includes a recess which is recessed from a surface of the mold layer.

According to exemplary embodiments of the inventive concept, a semiconductor device includes a semiconductor package including a semiconductor chip encapsulated with a mold layer and a set assembly assembled with the semiconductor package. The semiconductor chip includes at least one hot spot from which heat is generated. The semiconductor package includes at least one mark, which is provided on a surface of the semiconductor package facing the set assembly and at a position corresponding to the at least one hot spot.

In exemplary embodiments, the set assembly includes at least one of a set frame provided on the surface of the semiconductor package, and a heat dissipation layer provided between the surface of the semiconductor package and the set frame.

In exemplary embodiments, the mark includes a two-dimensional (2D) or three-dimensional (3D) design engraved on a portion of a surface of the mold layer, and the heat dissipation layer is provided on the surface of the mold layer to cover the design.

In exemplary embodiments, the mark includes a conductive layer filling a recess which is partially recessed from a surface of the mold layer, and the heat dissipation layer is provided on the surface of the mold layer to cover the conductive layer.

In exemplary embodiments, the recess and the conductive layer are spaced apart from the semiconductor chip.

In exemplary embodiments, the recess is provided to expose a portion of the semiconductor chip, and the conductive layer is in contact with the portion of the semiconductor chip exposed by the recess.

In exemplary embodiments, the mark includes a recess formed on a portion of a surface of the mold layer, and the heat dissipation layer is provided on the surface of the mold layer to cover the recess.

In exemplary embodiments, the mark includes a recess formed on a portion of a surface of the mold layer, and the heat dissipation layer is provided on the surface of the mold layer to fill the recess.

In exemplary embodiments, the semiconductor package further includes a heat dissipation plate provided on the mold layer, and the mark includes at least one expanding portion protruding from a surface of the heat dissipation plate corresponding to the hot spot toward the set frame.

In exemplary embodiments, the expanding portion of the heat dissipation plate is in contact with the set frame.

In exemplary embodiments, the expanding portion of the heat dissipation plate is spaced apart from the set frame.

In exemplary embodiments, the heat dissipation layer is provided on the surface of the heat dissipation plate to be in contact with the set frame.

According to exemplary embodiments of the inventive concept, a semiconductor device includes a semiconductor package mounted on a board, a set frame provided on the semiconductor package, and a heat dissipation layer provided between the semiconductor package and the set frame. The semiconductor package includes a semiconductor chip including a hot spot from which heat is generated, and a mold layer provided to encapsulate the semiconductor chip and to have a bottom surface adjacent to the board. The semiconductor package includes a mark which is provided at a position corresponding to the hot spot and contains information on a position for attachment between the semiconductor package and the heat dissipation layer.

In exemplary embodiments, the mark includes a two-dimensional (2D) or three-dimensional (3D) pattern provided on a top surface of the mold layer.

In exemplary embodiments, the pattern includes symbols or figures engraved on the top surface of the mold layer.

In exemplary embodiments, the pattern includes a recess which is recessed from the top surface of the mold layer toward the hot spot of the semiconductor chip.

In exemplary embodiments, the pattern further include a conductive layer filling the recess.

According to exemplary embodiments of the inventive concept, a semiconductor device includes a semiconductor package and a mark. The semiconductor package includes a semiconductor chip including a hot spot from which heat is generated, and a mold layer encapsulating the semiconductor chip. The mark is disposed on the semiconductor package. The mark is formed in a region of the semiconductor package that corresponds to a position of the hot spot.

According to exemplary embodiments of the inventive concept, a semiconductor device includes a semiconductor package, a set assembly, and a mark. The semiconductor package includes a semiconductor chip including a hot spot from which heat is generated, and a mold layer encapsulating the semiconductor chip. The set assembly is assembled with the semiconductor package. The mark is disposed on a surface of the semiconductor package. The surface of the semiconductor package faces the set assembly, and the mark is formed in a region of the semiconductor package that corresponds to a position of the hot spot.

According to exemplary embodiments of the inventive concept, a semiconductor device includes a semiconductor package mounted on a board, a set frame disposed on the semiconductor package, a heat dissipation layer disposed between the semiconductor package and the set frame, and a mark. The semiconductor package includes a semiconductor chip including a hot spot from which heat is generated, and a mold layer encapsulating the semiconductor chip and having a bottom surface adjacent to the board. The mark is disposed on a surface of the semiconductor package. The surface of the semiconductor package faces the heat dissipation layer, and the mark is formed in a region of the semiconductor package that corresponds to a position of the hot spot.

According to exemplary embodiments of the inventive concept, a semiconductor device includes a semiconductor package, a mark, and a thermal interface material (TIM) layer. The semiconductor package includes a semiconductor chip including a hot spot, and a mold layer encapsulating the semiconductor chip. The hot spot is disposed at a first portion of the semiconductor chip from which a large amount of heat relative to a remaining portion of the semiconductor chip is generated. The mark is disposed on an upper surface of the semiconductor package, and is substantially aligned with the hot spot. The TIM layer is disposed on the mark, and a center of the TIM layer is substantially aligned with the mark.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1A:
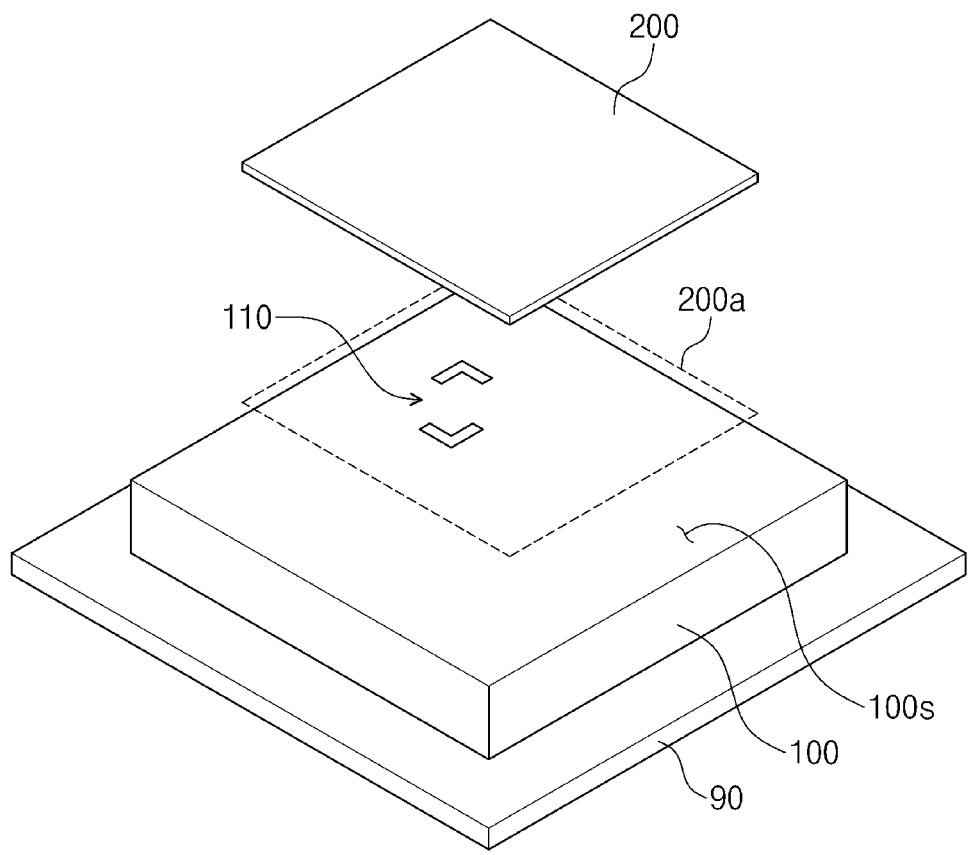
FIG. 1A is a perspective view illustrating an example of a semiconductor device according to an exemplary embodiment of the inventive concept.

Exemplary embodiments of the inventive concept will be described more fully hereinafter with reference to the accompanying drawings. In the drawings, the relative sizes, thicknesses and positioning of molecules, layers, regions and/or structural elements may be reduced or exaggerated for clarity. Like reference numerals may refer to like elements throughout the accompanying drawings.

As used herein, the singular terms "a," "an" and "the" are intended to include the plural forms as well, unless the context clearly indicates otherwise. It will be understood that when a component, such as a film, a region, a layer, a substrate, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

The shapes and sizes of the exemplary views in the drawings may be modified according to manufacturing techniques and/or allowable errors. Therefore, the exemplary embodiments of the inventive concept are not limited to the specific shapes illustrated in the exemplary views, but may include other shapes that may be created according to manufacturing processes.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art.

Figure 1B:
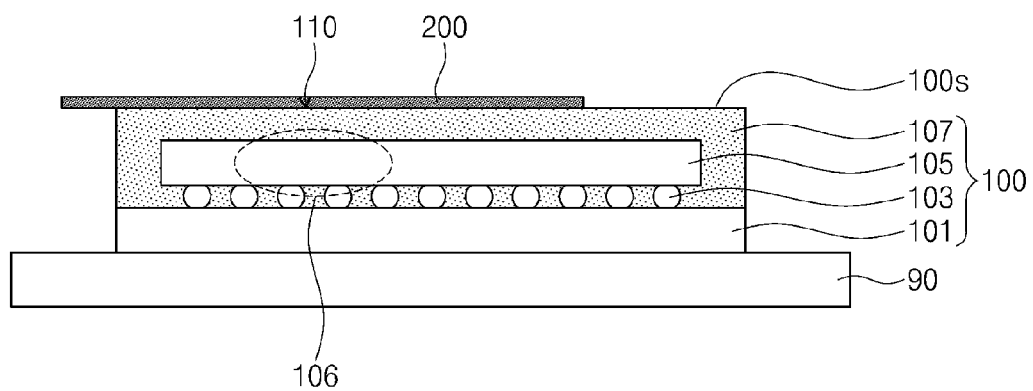
FIG. 1B is a cross-sectional view of the semiconductor device of FIG. 1A according to an exemplary embodiment of the inventive concept.
Figure 1C:
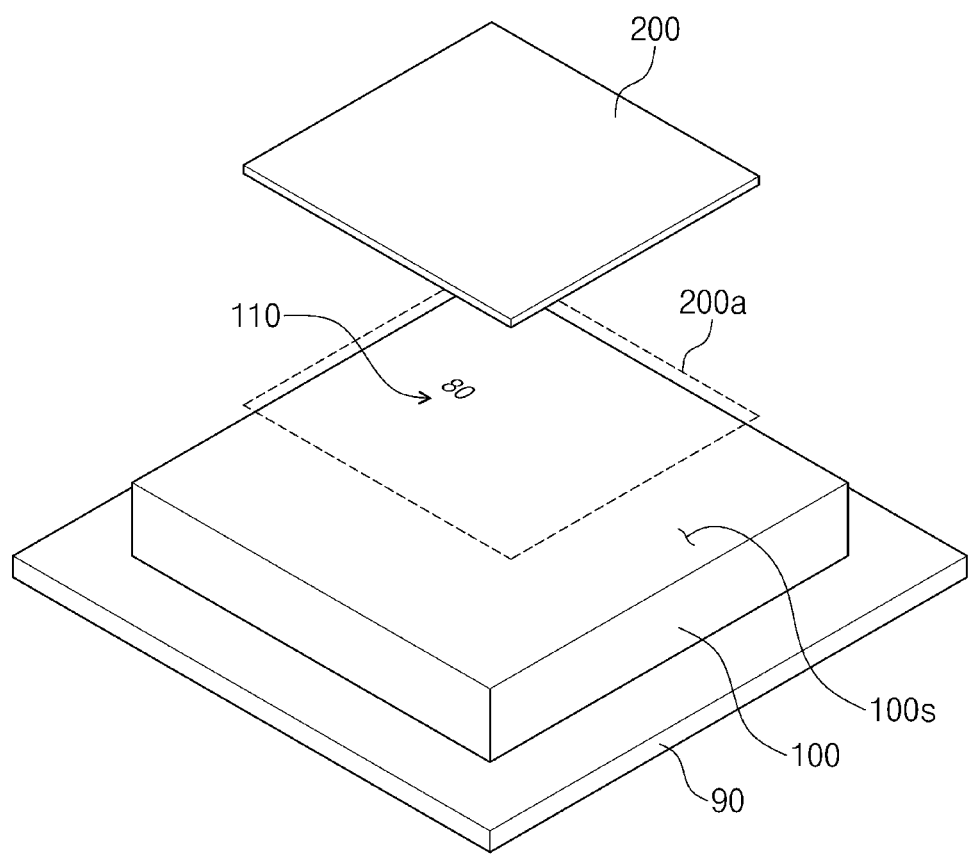
FIG. 1C is a perspective view illustrating an example of the semiconductor device of FIG. 1A according to an exemplary embodiment of the inventive concept.

FIG. 1A is a perspective view illustrating an example of a semiconductor device according to an exemplary embodiment of the inventive concept. FIG. 1B is a cross-sectional view of the semiconductor device of FIG. 1A according to an exemplary embodiment of the inventive concept. FIG. 1C is a perspective view illustrating an example of a semiconductor device of FIG. 1A according to an exemplary embodiment of the inventive concept.

Referring to FIG. 1A, a semiconductor package 100 is provided on a board 90. The board 90 may be used, for example, as a substrate/board of a portable electronic product (e.g., a smartphone, a tablet PC, etc.), or a memory module. One or more marks 110 may be formed on a top surface 100s of the semiconductor package 100. The one or more marks 110 may be engraved on the top surface 100s of the semiconductor package 100. The one or more marks 110 may contain information (e.g., thermal information) associated with a hot spot 106 of a semiconductor chip 105, as described further below.

In exemplary embodiments, a heat dissipation layer 200 (e.g., a thermal interface material (TIM)) is formed to cover at least a portion of the top surface 100s of the semiconductor package 100. The heat dissipation layer 200 may be provided, for example, in the form of a film. According to exemplary embodiments, the area/size of the heat dissipation layer 200 may be about equal to or different from the top surface 100s of the semiconductor package 100. That is, although the heat dissipation layer 200 is illustrated in FIG. 1A as having an area smaller than the top surface 100s of the semiconductor package 100, exemplary embodiments of the inventive concept are not limited thereto. For example, in an exemplary embodiment, the heat dissipation layer 200 may have an area/size that is about equal to or greater than the top surface 100s of the semiconductor package 100.

Referring to FIG. 1B, in an exemplary embodiment, the semiconductor package 100 is mounted on a package substrate 101 (e.g., a printed circuit board (PCB)) and includes at least one semiconductor chip 105 covered with a mold layer 107. The semiconductor chip 105 may be mounted on the package substrate 101 in, for example, a flip-chip bonding manner. For example, the semiconductor chip 105 may be provided on the package substrate 101 in such a way that its active surface is inverted to face the package substrate 101, and the semiconductor chip 105 may be electrically connected to the package substrate 101 through one or more bumps 103. In exemplary embodiments, the mold layer 107 is formed to be thick enough to completely cover the semiconductor chip 105. A top surface of the mold layer 107 may correspond to the top surface 100s of the semiconductor package 100. The mark 110 may be engraved on the top surface of the mold layer 107 to have a visually perceivable shape. The mold layer includes a bottom surface that is adjacent to the board 90.

The semiconductor chip 105 may include, for example, a memory circuit, a logic circuit, or any combination thereof. For example, the semiconductor chip 105 may include an application processor (AP). In exemplary embodiments, the semiconductor chip 105 may be electrically connected to the package substrate 101 by at least one wire bonding or at least one through electrode formed in the semiconductor chip 105. The semiconductor package 100 may include a single semiconductor chip 105 or a plurality of semiconductor chips 105 (e.g., the semiconductor package 100 may have a multi-chip package structure).

Referring to FIGS. 1A and 1B, the semiconductor chip 105 may have at least one hot spot 106. The hot spot 106 is a portion of the semiconductor chip 105 that generates a large amount of heat relative to the rest of the semiconductor chip 105. The at least one mark 110 is provided on the top surface 100s of the semiconductor package 100 to indicate a position corresponding to the hot spot 106. That is, the at least one mark 110 is formed in a region of the semiconductor package 100 that corresponds to a position of the hot spot 106 on the semiconductor chip 105. Thus, the mark 110 indicates a region corresponding to the hot spot 106, which generates a relatively large amount of heat, of the semiconductor package 100. When the heat dissipation layer 200 is attached to the top surface 100s of the semiconductor package 100, the mark 110 allows the heat dissipation layer 200 to be attached to a proper position of the semiconductor package 100.

The mark 110 may include a two-dimensional (2D) or three-dimensional (3D) visual design or pattern, which can be visually perceived. For example, the mark 110 may be provided in the form of a symbol or figure, which are respectively illustrated in FIGS. 1A and 1C, and may contain thermal information associated with the hot spot 106. The heat dissipation layer 200 may be provided on a cover region 200a including the mark 110, and may be attached to the top surface 100s of the semiconductor package 100. As an example, the cover region 200a may be disposed in such a way that its center is substantially aligned with the mark 110. That is, the cover region 200a may be disposed such that its center is exactly aligned with the mark 110 or is almost exactly with the mark 110. However, exemplary embodiments of the inventive concept are not limited thereto. Thus, the cover region 200a overlaps the mark 110. The cover region 200a may include a region extending beyond the top surface 100s of the semiconductor package 100 or beyond an edge of the semiconductor package 100. Alternatively, the cover region 200a may be confined within the top surface 100s of the semiconductor package 100.

According to an exemplary embodiment of the inventive concept, the mark 110 overlaps the hot spot 106, and the heat dissipation layer 200 (e.g., the thermal interface material (TIM) layer) overlaps the mark 110. For example, in an exemplary embodiment, the mark is substantially aligned (e.g., exactly aligned or almost exactly aligned within a measurement error) with the hot spot 106, and the center of the heat dissipation layer 200 is substantially aligned (e.g., exactly aligned or almost exactly aligned within a measurement error) with the mark 110.

Figure 2A:
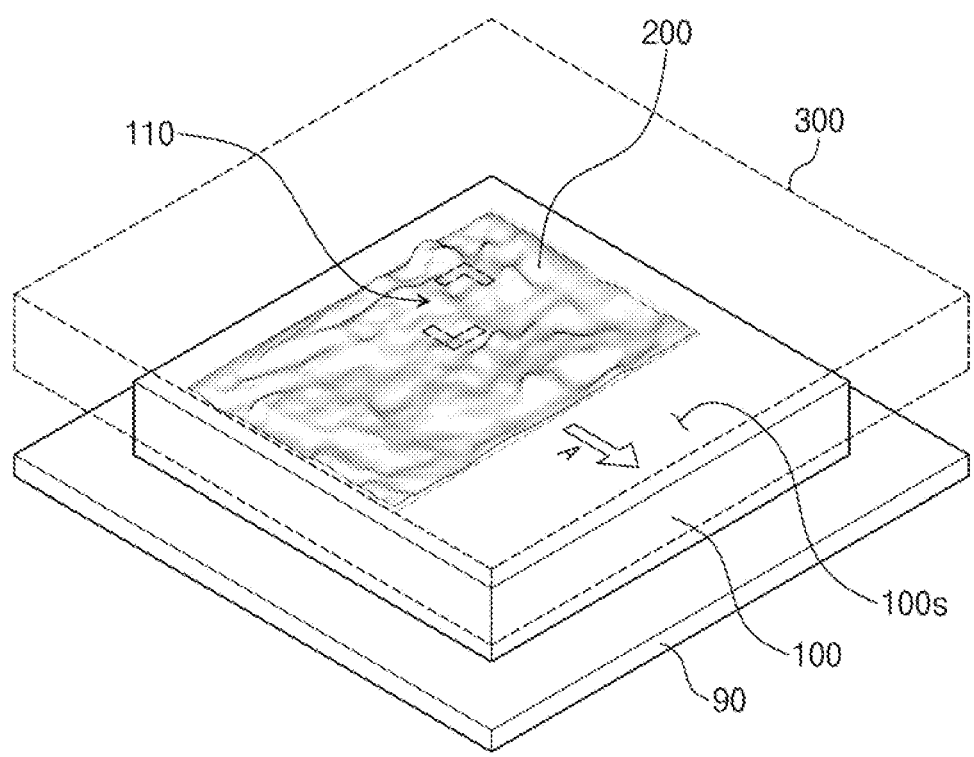
FIG. 2A is a perspective view illustrating an electronic product in which a semiconductor package according to an exemplary embodiment of the inventive concept is provided.
Figure 2B:
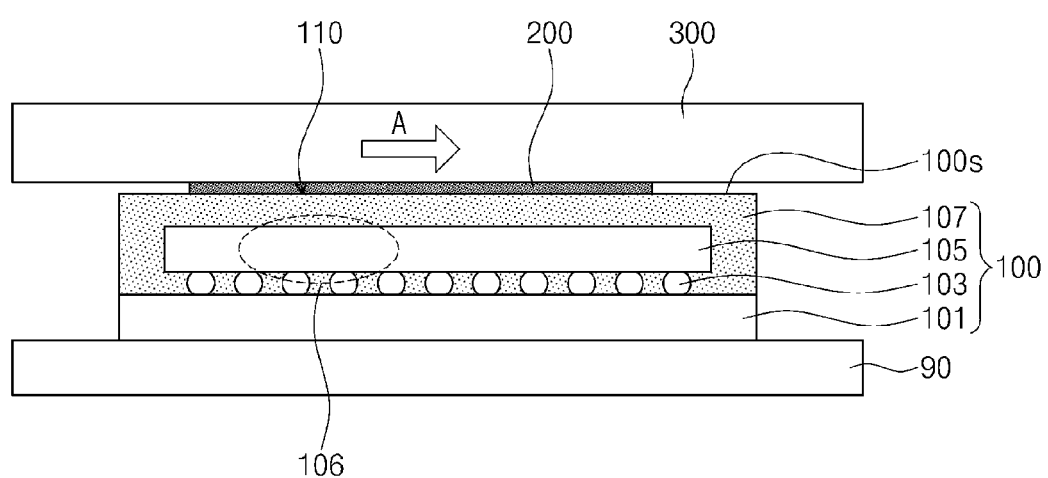
FIG. 2B is a cross-sectional view of the electronic product of FIG. 2A according to an exemplary embodiment of the inventive concept.
Figure 3:
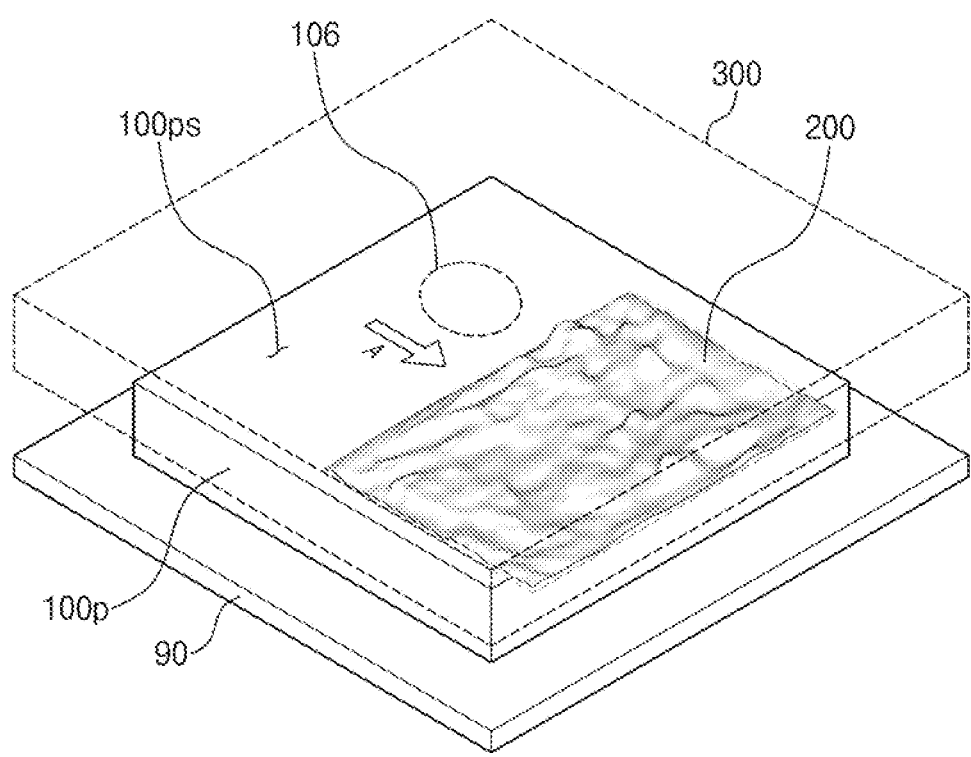
FIG. 3 is a perspective view illustrating a semiconductor device according to a comparative example.

FIG. 2A is a perspective view illustrating an electronic product in which a semiconductor package according to an exemplary embodiment of the inventive concept is provided. FIG. 2B is a cross-sectional view of the electronic product of FIG. 2A according to an exemplary embodiment of the inventive concept. FIG. 3 is a perspective view illustrating a semiconductor device according to a comparative example.

Referring to FIGS. 2A and 2B, the semiconductor package 100 may be assembled into, for example, portable electronic products (e.g., smartphones, tablet PCs, etc.) or high-power consumer electronic products (e.g., TV sets, servers, etc.) by a set assembly process. Even if the heat dissipation layer 200 is attached to a proper region, the heat dissipation layer 200 may be slipped or shrunken in a specific direction A by a frictional force, which may be applied to the heat dissipation layer 200 from components (e.g., a cover or a frame 300) of the electronic product during the set assembly process. Thus, the heat dissipation layer 200 may stray from the proper attaching region.

In exemplary embodiments, since the heat dissipation layer 200 is provided to cover the cover region 200a including the mark 110 as shown in FIG. 1A, the hot spot 106 corresponding to the mark 110 may be covered with the heat dissipation layer 200, even when the heat dissipation layer 200 is slipped or shrunken. That is, the use of the heat dissipation layer 200 according to exemplary embodiments of the inventive concept may prevent the heat-dissipation property of the semiconductor package 100 from being deteriorated, even when a position of the heat dissipation layer 200 is slightly changed during the set assembly process.

In contrast, in a case in which the mark 110 is absent, as shown in the comparative example of FIG. 3, the heat dissipation layer 200 may not cover the hot spot 106 when it is attached to the semiconductor package 100p. For example, even if the heat dissipation layer 200 is provided to cover the entire top surface 100ps of the semiconductor package 100p, during the set assembly process of the semiconductor package 100p, the heat dissipation layer 200 may be slipped in a specific direction A by a frictional force, which may be applied to the heat dissipation layer 200 from the frame 300 (also referred to herein as a set frame 300). In this case, the heat dissipation layer 200 may fail to cover the hot spot 106. If the hot spot 106 is not covered with the heat dissipation layer 200, the heat-dissipation property of the semiconductor package 100p may be deteriorated, which may result in an operational fault of the semiconductor package 100p. According to exemplary embodiments of the inventive concept, since the hot spot 106 is covered (e.g., partially covered or wholly covered) with the heat dissipation layer 200 as a result of the utilization of the at least one mark 110, deterioration of the heat-dissipation property of the semiconductor package 100 may be prevented or reduced, unlike the semiconductor package 100p of the comparative example of FIG. 3.

Figure 4:
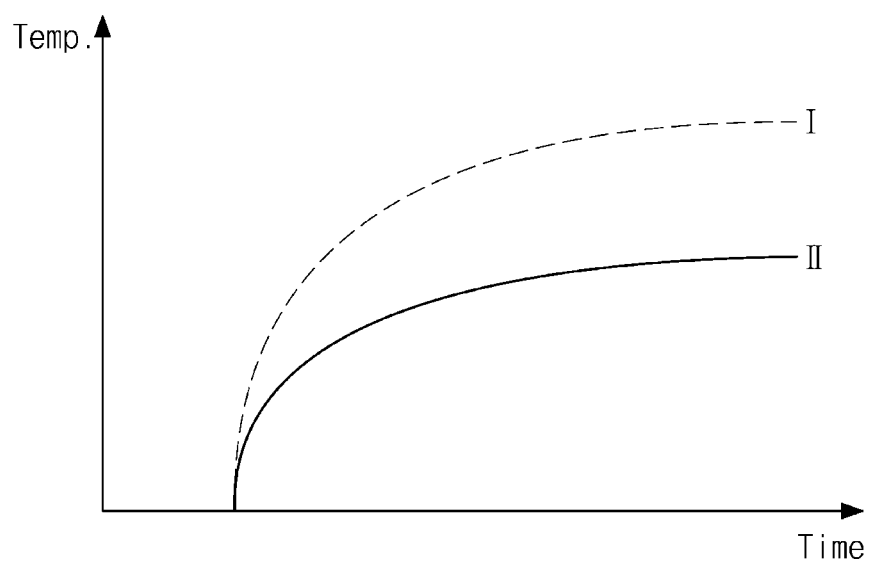
FIG. 4 is a graph showing an example of temporal changes in the temperature of the semiconductor packages of FIGS. 2A and 3.

FIG. 4 is a graph showing an example of temporal changes in the temperature of the semiconductor packages of FIGS. 2A and 3.

Referring to FIG. 4, in a case in which the heat dissipation layer 200 does not cover the hot spot 106, as illustrated in the comparative example of FIG. 3, the temperature of the semiconductor package 100p may be rapidly increased over time (e.g., test or usage time), as depicted by the dotted line I. In contrast, in a case in which the heat dissipation layer 200 is provided to wholly or partially cover the mark 110 indicating the hot spot 106, as illustrated in the exemplary embodiments of FIGS. 2A and 2B, the temperature of the semiconductor package 100 may increase more slowly over time, as depicted by the solid line II. Thus, the semiconductor package 100 according to exemplary embodiments of the inventive concept may have improved thermal characteristics compared to the semiconductor package 100p according to the comparative example.

Figure 5A:
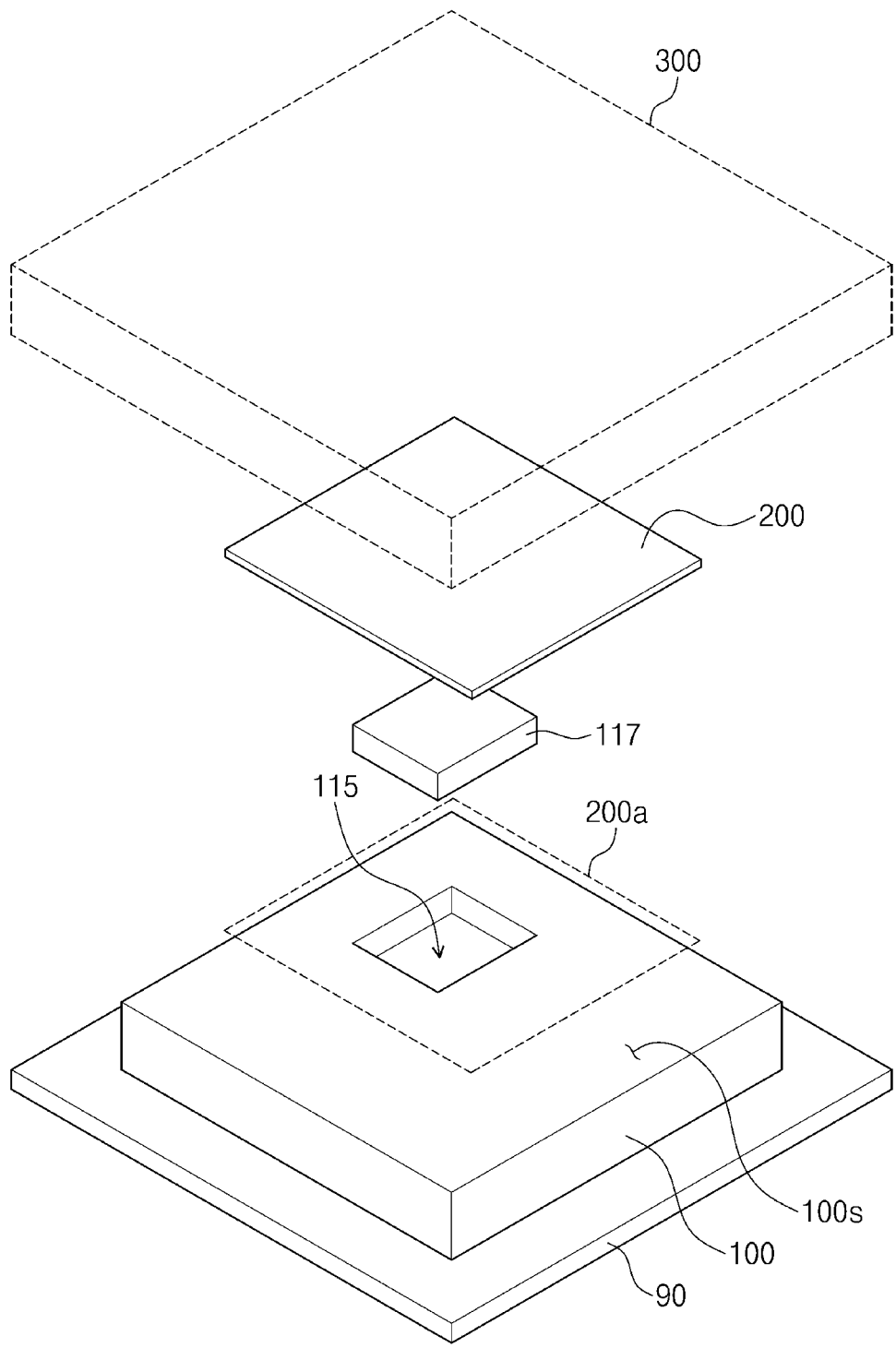
FIG. 5A is a perspective view illustrating a semiconductor device according to an exemplary embodiment of the inventive concept.
Figure 5B:
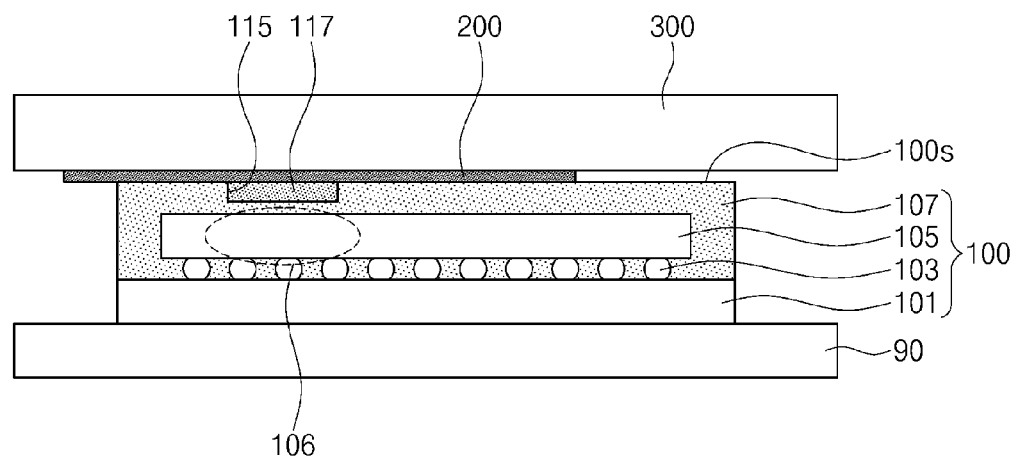
FIG. 5B is a cross-sectional view of the semiconductor device of FIG. 5A according to an exemplary embodiment of the inventive concept.

FIG. 5A is a perspective view illustrating a semiconductor device according to an exemplary embodiment of the inventive concept. FIG. 5B is a cross-sectional view of the semiconductor device of FIG. 5A according to an exemplary embodiment of the inventive concept. FIGS. 5C to 5G are cross-sectional views illustrating examples of the semiconductor device of FIG. 5B according to exemplary embodiments of the inventive concept.

Referring to FIGS. 5A and 5B, the semiconductor package 100 may include a recess 115 formed at the top surface 100s of the semiconductor package 100. For example, the recess 115 may be formed by etching a portion of the mold layer 107 of the semiconductor package 100. The recess 115 may be formed in an upper surface of the mold layer 107. The recess 115 may be formed at a position corresponding to the hot spot 106. For example, the recess 115 may be aligned with the hot spot 106 (e.g., the recess 115 may overlap the hot spot 106). The recess 115 may be filled with a conductive layer 117. The conductive layer 117 may be formed by filling the recess 115 with a conductive material (e.g., a metallic, soldering, or TIM material). The conductive layer 117 may be exposed through the top surface of the mold layer 107. In an exemplary embodiment, the conductive layer 117 may have a top surface that is substantially coplanar with the top surface of the mold layer 107. That is, the top surface of the conductive layer 117 and the top surface of the mold layer 107 may be exactly aligned in the same plane or almost exactly aligned in the same plane. In an exemplary embodiment, the conductive layer 117 may serve as a mark (e.g., the mark 110) indicating a position of the hot spot 106 of the semiconductor package 100.

In an exemplary embodiment, the depth of the recess 115 is smaller than the distance between top surfaces of the semiconductor chip 105 and the mold layer 107. Thus, in an exemplary embodiment, a space exists between the conductive layer 117 and the semiconductor chip 105, and the conductive layer 117 is not in contact with the semiconductor chip 105. The conductive layer 117 may serve as a mark indicating a position of the hot spot 106 of the semiconductor package 100.

Figure 5C:
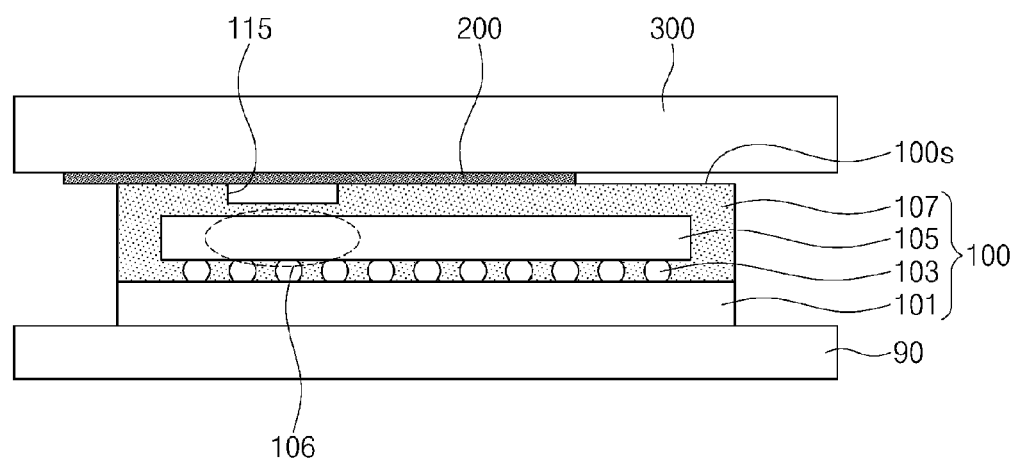
FIGS. 5C to 5G are cross-sectional views illustrating examples of the semiconductor device of FIG. 5B according to exemplary embodiments of the inventive concept.

The heat dissipation layer 200 may be provided on the top surface 100s of the semiconductor package 100. On the cover region 200a, the heat dissipation layer 200 may cover the conductive layer 117. As described previously with reference to FIGS. 2A and 2B, according to exemplary embodiments, even if the heat dissipation layer 200 is slipped or shrunken by a frictional force between the heat dissipation layer 200 and the frame 300, the heat dissipation layer 200 remains covering the conductive layer 117. Heat generated in the semiconductor chip 105, including heat at the hot spot 106, may be exhausted from the semiconductor package 100 through the conductive layer 117 and the heat dissipation layer 200. In exemplary embodiments, as shown in FIG. 5C, the recess 115 may remain empty and may serve as a mark (e.g., the mark 110) indicating a position of the hot spot 106 of the semiconductor package 100. That is, in exemplary embodiments, the recess 115 is present and serves as a mark (e.g., the mark 110) indicating a position of the hot spot 105, and the conductive layer 117 is not formed in the recess 115.

Figure 5D:
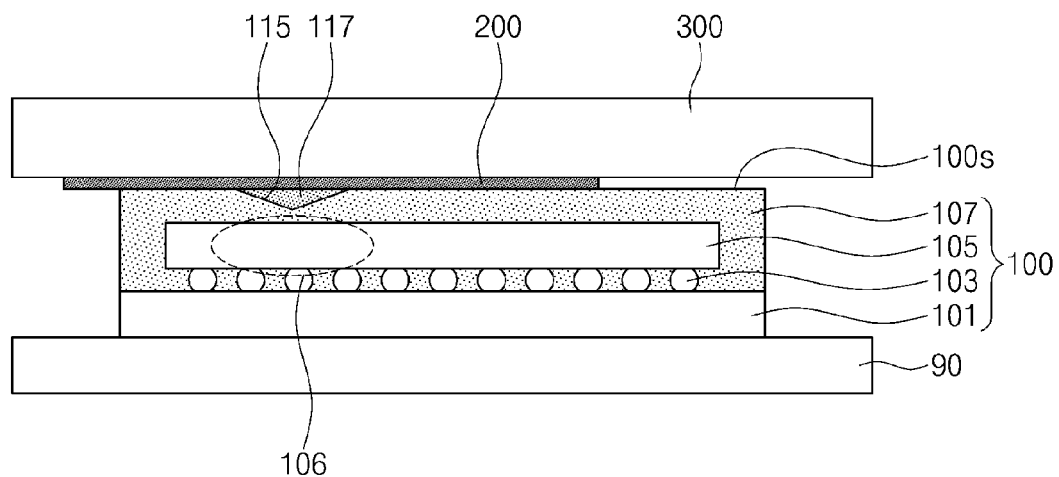
Figure 5E:
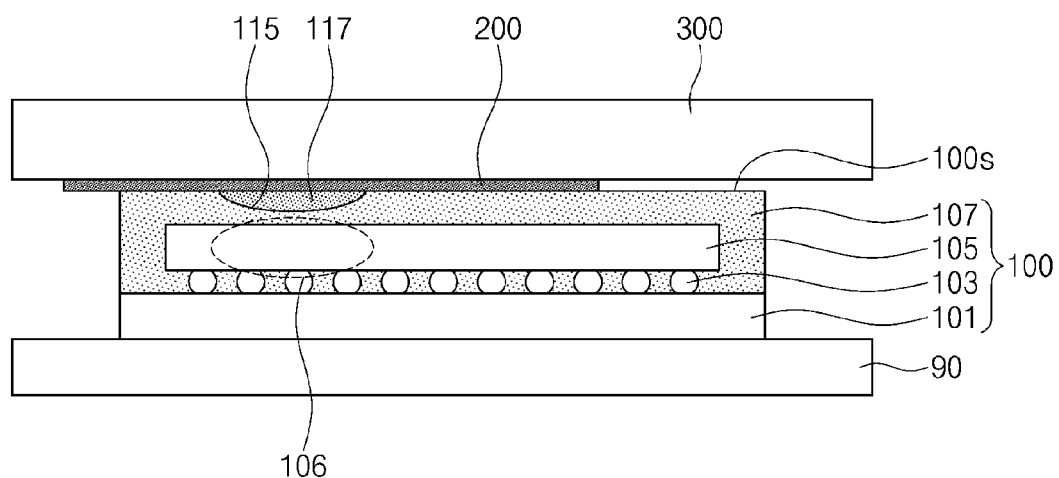

In an exemplary embodiment, the recess 115 has a rectangular cross-section shape, as shown in FIG. 5B. For example, in FIG. 5B, the width of the recess 115 at the uppermost surface of the recess 115 is substantially the same as the width of the recess 115 at the lowermost surface of the recess 115. In an exemplary embodiment, the recess 115 has a wedged cross-section shape, as shown in FIG. 5D. For example, in FIG. 5D, the width of the recess 115 decreases from the uppermost surface of the recess 115 toward a lowermost point located at the bottom of the recess 115. In an exemplary embodiment, the recess 115 has a hemispherical/circular cross-section shape, as shown in FIG. 5E. The shape of the recess 115 according to exemplary embodiments of the inventive concept is not limited to the exemplary embodiments shown in FIGS. 5B, 5D and 5E.

As shown in FIG. 5B, the heat dissipation layer 200 and the frame 300 are disposed on the semiconductor package 100. The heat dissipation layer 200 and/or the frame 300 may be referred to herein in as a set assembly, which is assembled with the semiconductor package 100.

Figure 5F:
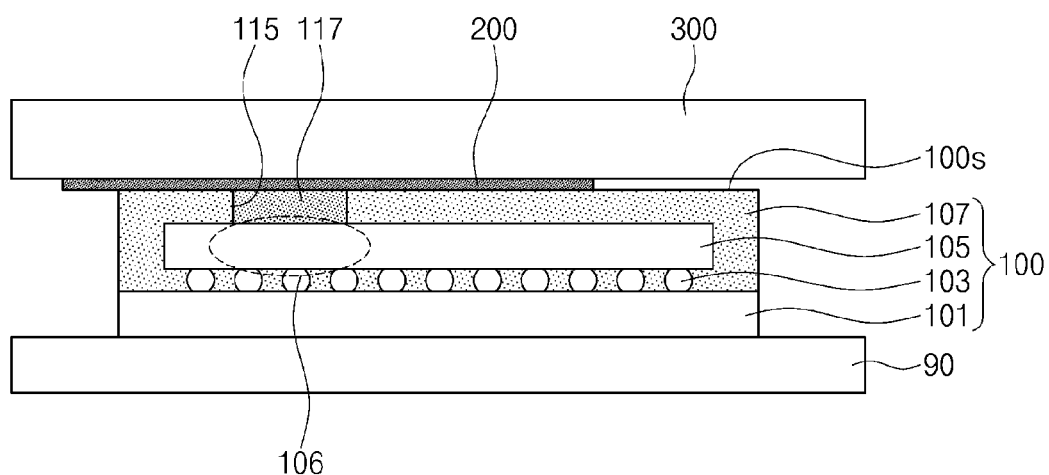

As shown in FIG. 5F, in an exemplary embodiment, the depth of the recess 115 is not smaller than the distance between top surfaces of the semiconductor chip 105 and the mold layer 107. Thus, the recess 115 exposes a portion of the top surface (e.g., an inactive surface) of the semiconductor chip 105. As a result, in an exemplary embodiment, the conductive layer 117 is in contact with a portion of the top surface of the semiconductor chip 105 exposed by the recess 115. An insulating layer may be provided on the top surface of the semiconductor chip 105, which is in contact with the conductive layer 117.

Figure 5G:
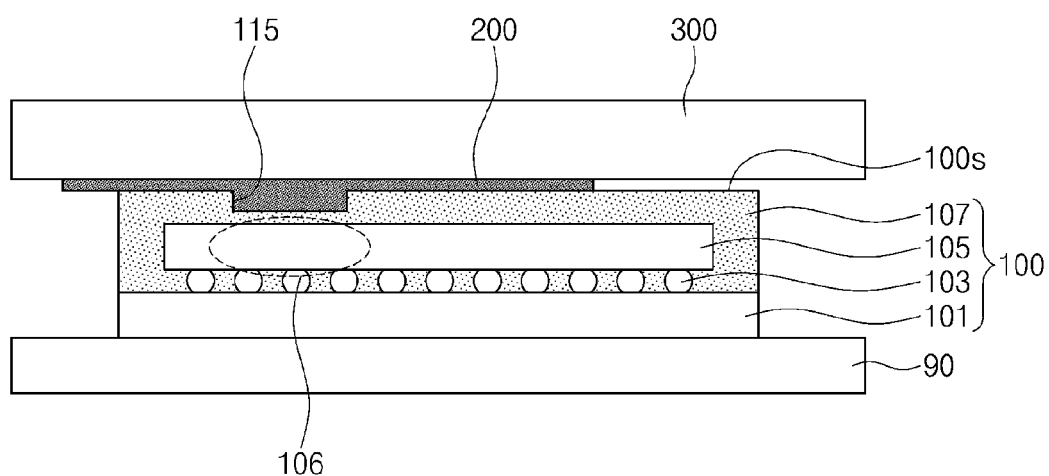

As shown in FIG. 5G, in an exemplary embodiment, the recess 115 is filled with the heat dissipation layer 200. For example, in an exemplary embodiment, the heat dissipation layer 200 is formed to cover the mold layer 107 and fill the recess 115. In exemplary embodiments, the heat dissipation layer 200 may be formed, for example, by coating a conductive paste. According to exemplary embodiments of the inventive concept, the heat dissipation layer 200 filling the recess 115 may serve as an anchor that prevents the heat dissipation layer 200 from being slipped from its proper position.

As shown in FIGS. 5B to 5G, in an exemplary embodiment, a portion of the heat dissipation layer 200 (e.g., the TIM layer 200) extends beyond an edge/periphery of the semiconductor package 100, and does not extend beyond an edge/periphery of the frame 300. Thus, in an exemplary embodiment, a center of the heat dissipation layer 200 is substantially aligned with the mark 110 (e.g., the recess 115 and/or the conductive layer 117 in FIGS. 5B to 5G) even when the mark 110 is not disposed at the center of the semiconductor package 100.

Figure 6A:
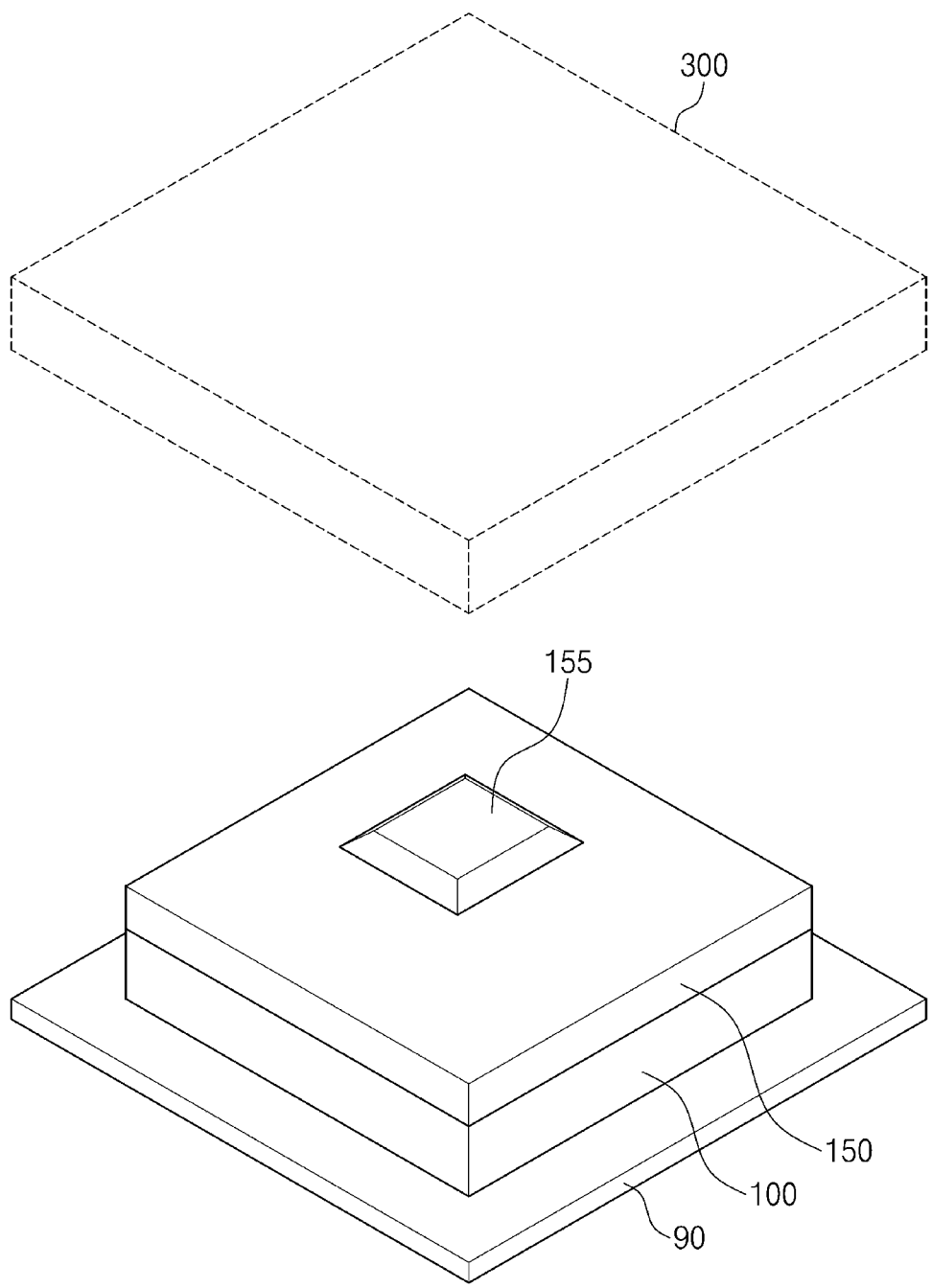
FIG. 6A is a perspective view illustrating a semiconductor device according to an exemplary embodiment of the inventive concept.
Figure 6B:
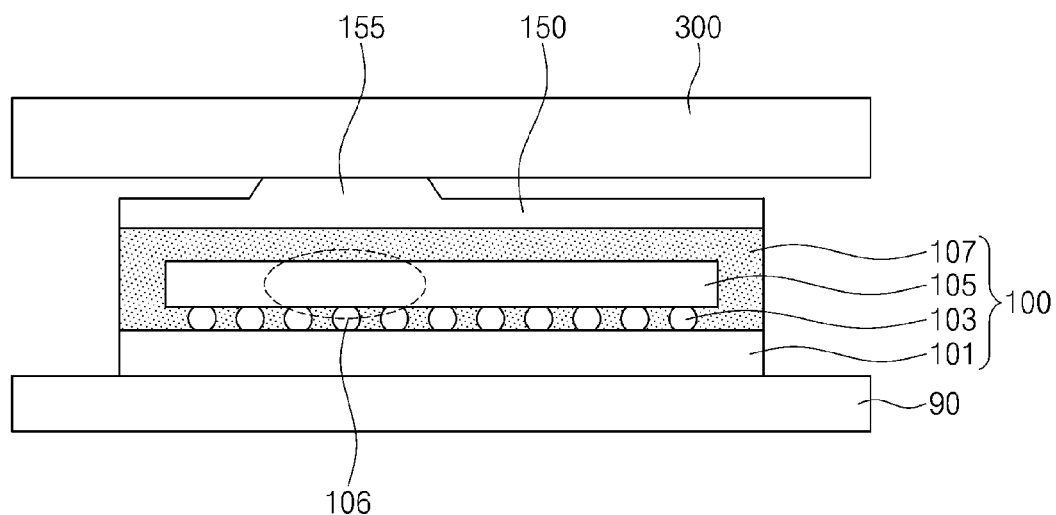
FIG. 6B is a cross-sectional view of the semiconductor device of FIG. 6A according to an exemplary embodiment of the inventive concept.
Figure 6C:
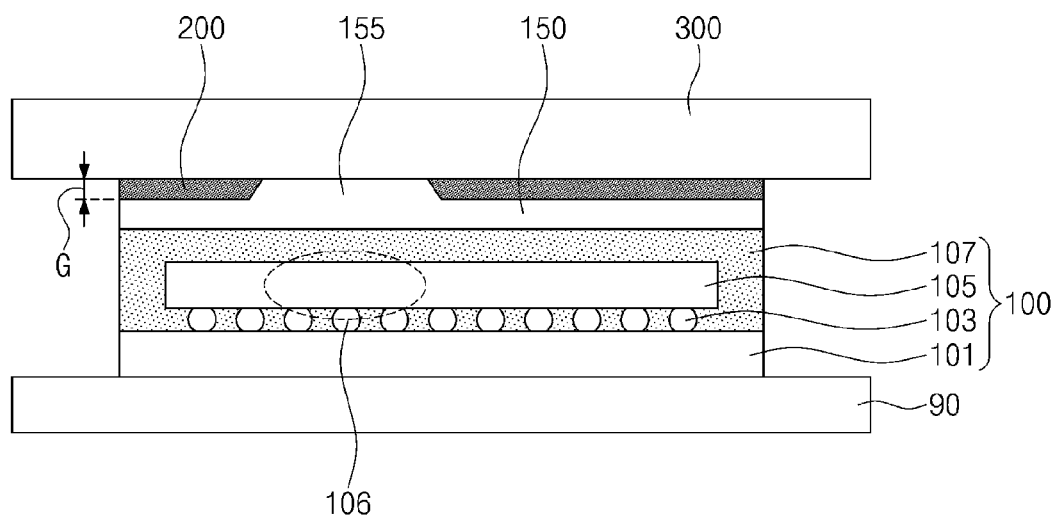
FIGS. 6C to 6E are cross-sectional views illustrating examples of the semiconductor device of FIG. 6B according to exemplary embodiments of the inventive concept.
Figure 6D:
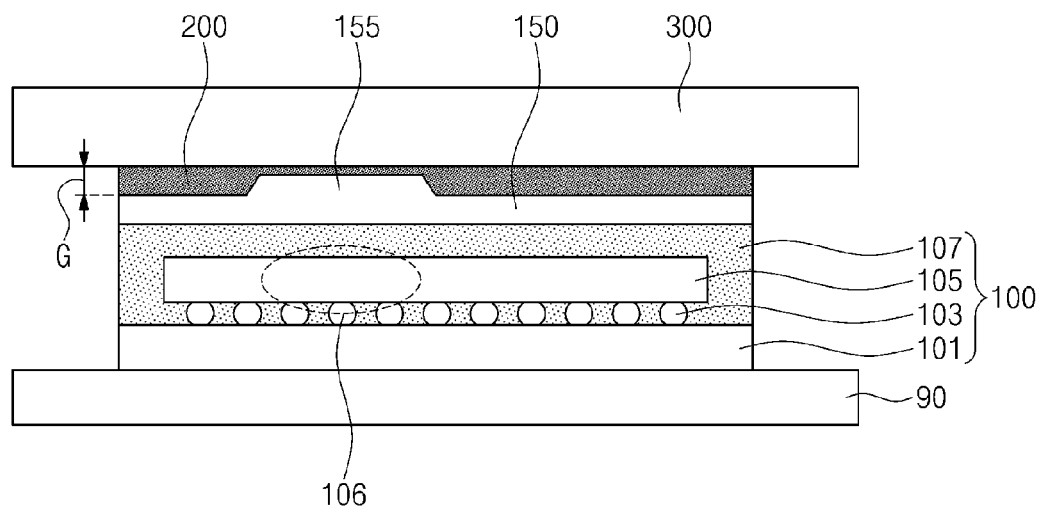
Figure 6E:
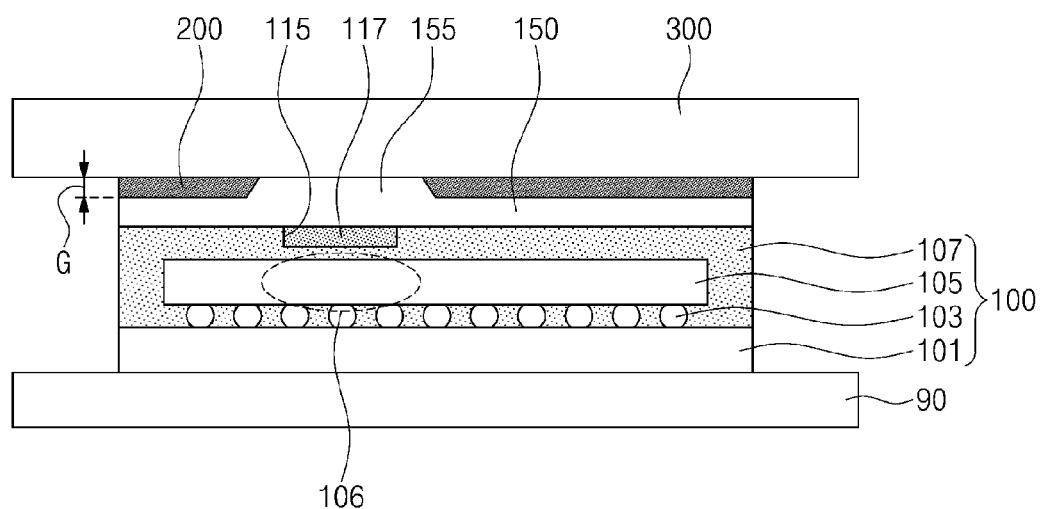

FIG. 6A is a perspective view illustrating a semiconductor device according to an exemplary embodiment of the inventive concept. FIG. 6B is a cross-sectional view of the semiconductor device of FIG. 6A according to an exemplary embodiment of the inventive concept. FIGS. 6C to 6E are cross-sectional views illustrating examples of the semiconductor device of FIG. 6B according to exemplary embodiments of the inventive concept.

Referring to FIGS. 6A and 6B, in an exemplary embodiment, the semiconductor package 100 further includes a heat dissipation plate 150 provided on the mold layer 107. The heat dissipation plate 150 includes at least one expanding portion 155 protruding in a direction away from the mold layer 107. For example, the expanding portion 155 may have an upwardly protruding shape. The expanding portion 155 may be provided at a position corresponding to the hot spot 106 of the semiconductor chip 105. Thus, the expanding portion 155 may serve as a mark (e.g., the mark 110) indicating a position of the hot spot 106 of the semiconductor package 100.

The expanding portion 155 may be shaped as, for example, a truncated pyramid, a rectangular pillar, or a circular pillar. The expanding portion 155 of the heat dissipation plate 150 may be in contact with the frame 300. Heat generated in the semiconductor chip 105, including heat at the hot spot 106, may be exhausted from the semiconductor package 100 through the expanding portion 155 and the frame 300.

In an exemplary embodiment, as shown in FIG. 6C, the heat dissipation layer 200 is provided on the heat dissipation plate 150. The heat dissipation layer 200 may be provided to fill a gap G between the heat dissipation plate 150 and the frame 300. The heat dissipation layer 200 is in contact with the frame 300 and the heat dissipation plate 150.

In an exemplary embodiment, as shown in FIG. 6D, the expanding portion 155 of the heat dissipation plate 150 is not in contact with the frame 300. The heat dissipation layer 200 may be further provided to fill a gap G between the heat dissipation plate 150 and the frame 300, and to be in contact with the frame 300. Alternatively, in an exemplary embodiment, the gap is not filled with the heat dissipation layer 200.

In an exemplary embodiment, as shown in FIG. 6E, the mold layer 107 further includes the recess 115. The recess 115 may or may not be filled with the conductive layer 117 according to exemplary embodiments. For example, in exemplary embodiments, the expanding portion 155 of the heat dissipation plate 150 may be provided to be in contact with or to be spaced apart from the frame 300. The heat dissipation layer 200 may be further provided on the heat dissipation plate 150 to fill the gap G between the heat dissipation plate 150 and the frame 300. Alternatively, in an exemplary embodiment, the gap G is not filled with the heat dissipation layer 200.

According to exemplary embodiments of the inventive concept, marks (e.g., symbols, figures, patterns, etc.) indicating a position of a hot spot are formed on a top surface of a semiconductor package to allow a heat dissipation layer to be attached on the hot spot. In addition, even if the heat dissipation layer is moved away from a desired attaching position, the mark remains covered with the heat dissipation layer. Thus, exemplary embodiments of the inventive concept may prevent or reduce deterioration of a semiconductor package due to thermal issues, and may improve thermal characteristics of a semiconductor package by improving the implementation of a heat-dissipation structure.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
a semiconductor package, comprising:
a semiconductor chip comprising a hot spot from which heat is generated; and
a mold layer encapsulating the semiconductor chip;
a mark disposed on the semiconductor package, wherein the mark is formed in a region of the semiconductor package that corresponds to a position of the hot spot;
a heat dissipation layer attached to a top surface of the semiconductor package, wherein the heat dissipation layer is disposed on and overlaps the mark; and a heat dissipation plate disposed on the mold layer, wherein the heat dissipation plate comprises an expanding portion protruding from the heat dissipation plate, and the mark comprises the expanding portion.

2. The semiconductor device of claim 1, wherein the mark comprises a symbol or a figure engraved on a surface of the mold layer.

3. The semiconductor device of claim 1, wherein the mark comprises a conductive layer disposed in the mold layer, and a surface of the conductive layer is exposed by the mold layer.

4. The semiconductor device of claim 3, wherein the conductive layer comprises a metallic material.

5. The semiconductor device of claim 3, wherein the conductive layer is spaced apart from the semiconductor chip.

6. The semiconductor device of claim 3, wherein the conductive layer contacts a portion of the semiconductor chip.

7. The semiconductor device of claim 1, wherein the mark comprises a recess formed in an upper surface of the mold layer.

8. A semiconductor device, comprising:
a semiconductor package, comprising:
a semiconductor chip comprising a hot spot from which heat is generated;
a mold layer encapsulating the semiconductor chip; and
a heat dissipation plate disposed on the mold layer;
a set assembly assembled with the semiconductor package; and
a mark disposed on a surface of the semiconductor package, wherein the surface of the semiconductor package faces the set assembly, and the mark is formed in a region of the semiconductor package that corresponds to a position of the hot spot,
wherein the heat dissipation plate comprises an expanding portion protruding from the heat dissipation plate, and the mark comprises the expanding portion.

9. The semiconductor device of claim 8, wherein the set assembly comprises at least one of:
a set frame disposed on the surface of the semiconductor package; and
a heat dissipation layer disposed between the surface of the semiconductor package and the set frame.

10. The semiconductor device of claim 9, wherein the mark comprises a recess formed in a surface of the mold layer, and the heat dissipation layer is disposed on the surface of the mold layer and fills the recess.

11. The semiconductor device of claim 9, wherein the expanding portion protrudes from a surface of the heat dissipation plate toward the set frame.

12. The semiconductor device of claim 11, wherein the expanding portion contacts the set frame.

13. The semiconductor device of claim 8, further comprising:
a conductive layer filling a recess formed in a surface of the mold layer.

14. The semiconductor device of claim 13, wherein the recess and the conductive layer are spaced apart from the semiconductor chip.

15. The semiconductor device of claim 13, wherein the recess exposes a portion of the semiconductor chip, and the conductive layer contacts the portion of the semiconductor chip exposed by the recess.

16. The semiconductor device of claim 13, wherein the conductive layer comprises a metallic material.

* * * * *